United States Patent
Panagopoulos

(10) Patent No.: US 8,133,349 B1
(45) Date of Patent: Mar. 13, 2012

(54) RAPID AND UNIFORM GAS SWITCHING FOR A PLASMA ETCH PROCESS

(75) Inventor: Theo Panagopoulos, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 12/938,918

(22) Filed: Nov. 3, 2010

(51) Int. Cl.
*H01L 21/306* (2006.01)
*H01L 21/3065* (2006.01)
*C23C 16/00* (2006.01)
*C23C 16/505* (2006.01)
*C23C 16/455* (2006.01)

(52) U.S. Cl. ......... 156/345.48; 156/345.33; 156/345.34; 118/715; 118/723 I

(58) Field of Classification Search .................. 118/715, 118/723 I; 156/345.48, 345.33, 345.34
See application file for complete search history.

(56) References Cited

U.S. PATENT DOCUMENTS

| | | | |
|---|---|---|---|
| 4,980,204 A | 12/1990 | Fujii et al. | |
| 5,501,893 A | 3/1996 | Laermer et al. | |
| 5,997,649 A | 12/1999 | Hillman | |
| 6,013,155 A | 1/2000 | McMillin et al. | |
| 6,033,585 A | 3/2000 | Wicker et al. | |
| 6,051,503 A | 4/2000 | Bhardwaj et al. | |
| 6,261,962 B1 | 7/2001 | Bhardwaj et al. | |
| 6,270,862 B1 | 8/2001 | McMillin et al. | |
| 6,284,148 B1 | 9/2001 | Laermer et al. | |
| 6,303,512 B1 | 10/2001 | Laermer et al. | |
| 6,630,201 B2 * | 10/2003 | Chiang et al. ............ 427/255.28 | |
| 6,800,139 B1 | 10/2004 | Shinriki et al. | |
| 6,806,211 B2 * | 10/2004 | Shinriki et al. ............... 438/785 | |
| 6,924,235 B2 | 8/2005 | Johnson et al. | |
| 7,030,027 B1 * | 4/2006 | Suzuki .......................... 438/710 |
| 7,141,504 B1 | 11/2006 | Bhardwaj | |
| 7,166,233 B2 | 1/2007 | Johnson et al. | |
| 7,169,231 B2 | 1/2007 | Larson et al. | |
| 7,169,255 B2 | 1/2007 | Yasui et al. | |
| 7,371,332 B2 | 5/2008 | Larson et al. | |
| 7,396,771 B2 | 7/2008 | Miya et al. | |
| 7,459,100 B2 | 12/2008 | Kiermasz et al. | |
| 7,622,394 B2 | 11/2009 | Ikegami | |
| 7,648,611 B2 | 1/2010 | Laermer et al. | |
| 7,708,859 B2 | 5/2010 | Huang et al. | |
| 7,713,756 B2 | 5/2010 | Miya et al. | |
| 2001/0010257 A1 | 8/2001 | Ni et al. | |
| 2002/0192369 A1 | 12/2002 | Morimoto et al. | |
| 2003/0070620 A1 | 4/2003 | Cooperberg et al. | |

(Continued)

*Primary Examiner* — Jeffrie R Lund
(74) *Attorney, Agent, or Firm* — Buchanan Ingersoll & Rooney PC

(57) ABSTRACT

An inductively coupled plasma processing apparatus includes a processing chamber in which a semiconductor substrate is processed, a substrate support, a dielectric window forming a wall of the chamber, an antenna operable to generate and maintain a plasma in the processing chamber, and a showerhead plate of dielectric material adjacent the dielectric window. The showerhead plate includes gas holes in fluid communication with a plenum below the dielectric window, the plenum having a gas volume of no greater than 500 $cm^3$. The gas holes extend between the plenum and a plasma exposed surface of the showerhead plate and the gas holes have an aspect ratio of at least 2. A gas delivery system is operable to supply an etching gas and a deposition gas into the processing chamber through the showerhead plate while the semiconductor substrate is supported on the substrate support. The plasma processing apparatus can rapidly replace the etching gas in the plenum with the deposition gas within about 200 milliseconds and vice versa. The plasma processing apparatus is operable to etch silicon on the semiconductor substrate at a rate of 10 μm/minute or higher.

8 Claims, 4 Drawing Sheets

U.S. PATENT DOCUMENTS

| | | |
|---|---|---|
| 2003/0143328 A1 | 7/2003 | Chen et al. |
| 2003/0180458 A1* | 9/2003 | Sneh .................... 427/248.1 |
| 2005/0029221 A1 | 2/2005 | Chang et al. |
| 2005/0051100 A1* | 3/2005 | Chiang et al. ................ 118/728 |
| 2005/0241763 A1* | 11/2005 | Huang et al. ............ 156/345.33 |
| 2006/0213438 A1* | 9/2006 | Ishizaka et al. ............... 118/715 |
| 2006/0225655 A1* | 10/2006 | Faguet et al. ............ 118/723 R |
| 2007/0015371 A1 | 1/2007 | Olynick et al. |
| 2007/0066038 A1 | 3/2007 | Sadjadi et al. |
| 2007/0158025 A1 | 7/2007 | Larson |
| 2008/0085604 A1 | 4/2008 | Hoshino et al. |
| 2009/0184089 A1 | 7/2009 | Chebi et al. |
| 2009/0272717 A1 | 11/2009 | Pamarthy et al. |
| 2009/0286397 A1* | 11/2009 | Sadjadi .................... 438/680 |
| 2010/0000964 A1 | 1/2010 | Chen |
| 2010/0055400 A1 | 3/2010 | Farr et al. |
| 2010/0159707 A1* | 6/2010 | Huang et al. ................ 438/714 |
| 2011/0281435 A1* | 11/2011 | Sadjadi et al. ............... 438/703 |

* cited by examiner

US 8,133,349 B1

RAPID AND UNIFORM GAS SWITCHING FOR A PLASMA ETCH PROCESS

BACKGROUND

The Bosch process is a plasma etch process that has been widely used to fabricate deep vertical (high aspect ratio) features (with depth such as tens to hundreds of micrometers), such as trenches and vias, in the semiconductor industry. The Bosch process comprises cycles of alternating etching steps and deposition steps. Details of the Bosch process can be found in U.S. Pat. No. 5,501,893, which is hereby incorporated by reference. The Bosch process can be carried out in a plasma processing apparatus configured with a high-density plasma source, such as an inductively coupled plasma (ICP) source, in conjunction with a radio frequency (RF) biased substrate electrode. Process gases used in the Bosch process for etching silicon can be sulfur hexafluoride ($SF_6$) in an etching step and octofluorocyclobutane ($C_4F_8$) in a deposition step. The process gas used in the etching step and the process gas used in the deposition step are respectively referred to as "etch gas" and "deposition gas" hereinbelow. During an etching step, $SF_6$ facilitates spontaneous and isotropic etching of silicon (Si); during a deposition step, $C_4F_8$ facilitates the deposition of a protective polymer layer onto sidewalls as well as bottoms of the etched structures. The Bosch process cyclically alternates between etch and deposition steps enabling deep structures to be defined into a masked silicon substrate. Upon energetic and directional ion bombardment, which is present in the etching steps, any polymer film coated in the bottoms of etched structures from the previous deposition step will be removed to expose the silicon surface for further etching. The polymer film on the sidewall will remain because it is not subjected to direct ion bombardment, thereby, inhibiting lateral etching.

One limitation of the Bosch process is roughened sidewalls of etched deep features. This limitation is due to the periodic etch/deposition scheme used in the Bosch process and is known in the art as sidewall "scalloping". For many device applications, it is desirable to minimize this sidewall roughness or scalloping. The extent of scalloping is typically measured as a scallop length and depth. The scallop length is the peak-to-peak distance of the sidewall roughness and is directly correlated to the etch depth achieved during a single etch cycle. The scallop depth is the peak to valley distance of sidewall roughness and is correlated to the degree of anisotropy of an individual etching step. The extent of scallop formation can be minimized by shortening the duration of each etch/deposition step (i.e. shorter etch/deposition steps repeated at a higher frequency).

In addition to smoother feature sidewalls it is also desirable to achieve a higher overall etch rate. The overall etch rate is defined as a total depth etched in a process divided by a total duration of the process. The overall etch rate can be increased by increasing efficiency within a process step (i.e. decreasing dead time).

FIG. 1 illustrates a conventional plasma processing apparatus 100 for processing a substrate 120 comprises a substrate support 130 and a processing chamber 140 enclosing the substrate support 130. The substrate 120 may be, for example, a semiconductor wafer having diameters such as 4", 6", 8", 12", etc. The substrate support 130 may comprise, for example, a radio frequency (RF) powered electrode. The substrate support 130 may be supported from a lower endwall of the chamber 140 or may be cantilevered, e.g., extending from a sidewall of the chamber 140. The substrate 120 may be clamped to the electrode 130 either mechanically or electrostatically. The processing chamber 140 may, for example, be a vacuum chamber.

The substrate 120 is processed in the processing chamber 140 by energizing a process gas in the processing chamber 140 into a high density plasma. A source of energy maintains a high density (e.g., $10^{11}$-$10^{12}$ ions/cm$^3$) plasma in the chamber 140. For example, an antenna 150, such as the planar multiturn spiral coil shown in FIG. 1, a non-planar multiturn coil, or an antenna having another shape, powered by a suitable RF source and suitable RF impedance matching circuitry inductively couples RF energy into the chamber to generate a high density plasma. The RF power applied to the antenna 150 can be varied according to different process gases used in the chamber 140 (e.g. etch gas containing $SF_6$ and deposition gas containing $C_4F_8$). The chamber 140 may include a suitable vacuum pumping apparatus for maintaining the interior of the chamber 140 at a desired pressure (e.g., below 5 Torr, preferably 1-100 mTorr). A dielectric window, such as the planar dielectric window 155 of uniform thickness shown in FIG. 1, or a non-planar dielectric window (not shown) is provided between the antenna 150 and the interior of the processing chamber 140 and forms a vacuum wall at the top of the processing chamber 140. A gas delivery system 110 can be used to supply process gases into the chamber 140 through a primary gas ring 170 and/or injectors 180 below the dielectric window 155. Details of the plasma processing apparatus 100 in FIG. 1 are disclosed in commonly-owned U.S. Patent Application Publication Nos. 2001/0010257, 2003/0070620, U.S. Pat. No. 6,013,155, or U.S. Pat. No. 6,270,862, each of which is incorporated herein by reference in its entirety.

Gas delivery systems designed for fast gas switching are disclosed in commonly-owned U.S. Pat. Nos. 7,459,100 and 7,708,859 and U.S. Patent Publication Nos. 2007/0158025 and 2007/0066038, the disclosures of which are hereby incorporated by reference.

The substrate 120 preferably comprises a silicon material such as a silicon wafer and/or polysilicon. Various features such as holes, vias and/or trenches are to be etched into the silicon material. A patterned masking layer (e.g. photoresist, silicon oxide, and/or silicon nitride) having an opening pattern for etching desired features is disposed on the substrate 120.

One problem of the apparatus 100 of FIG. 1 is that the primary gas ring 170 is located closer to the periphery of the substrate 120 than to the center, which decreases etch rate due to the time needed for complete replacement of one process gas to another process gas over the surface of the substrate 120 and can lead to process non-uniformity due to gas pressure non-uniformity across the substrate during processing.

SUMMARY

Described herein is an inductively coupled plasma processing apparatus which includes a processing chamber in which a semiconductor substrate is processed, a substrate support on which the semiconductor substrate is supported during processing thereof, an antenna operable to generate and maintain a plasma in the processing chamber, a dielectric window forming a wall of the chamber, a showerhead plate adjacent to or incorporated in the dielectric window and a gas delivery system. The showerhead plate has gas holes therein in fluid communication with a plenum below or in the dielectric window. The plenum has a gas volume of no greater than 500 cm$^3$ and the gas holes extending between the plenum and a plasma exposed surface of the showerhead plate have an aspect ratio of at least 2. The gas delivery system is operable to alternately supply an etching gas and a deposition gas to the plenum and replace the etching gas in the plenum with the deposition gas within 200 milliseconds or replace the deposition gas in the plenum with the etching gas within 200 milliseconds. The plasma processing apparatus is operable to etch openings in silicon on the semiconductor substrate at a rate of at least 10 µm/minute.

DETAILED DESCRIPTION

The plasma processing apparatus described herein can achieve higher etch rates with greater uniformity than the conventional apparatus 100 described above.

Figure 1:
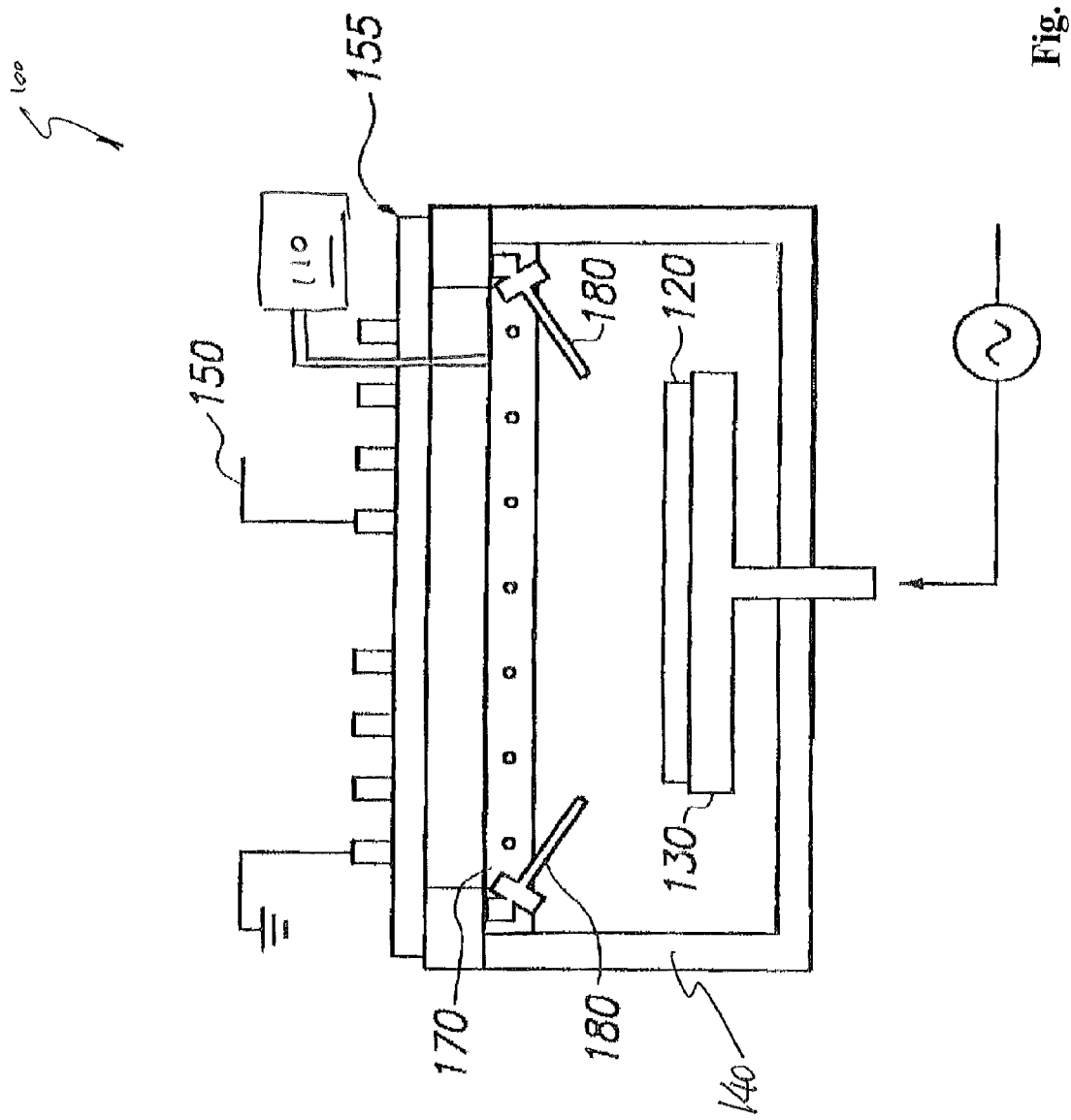
FIG. 1 shows a conventional plasma processing apparatus.
Figure 2:
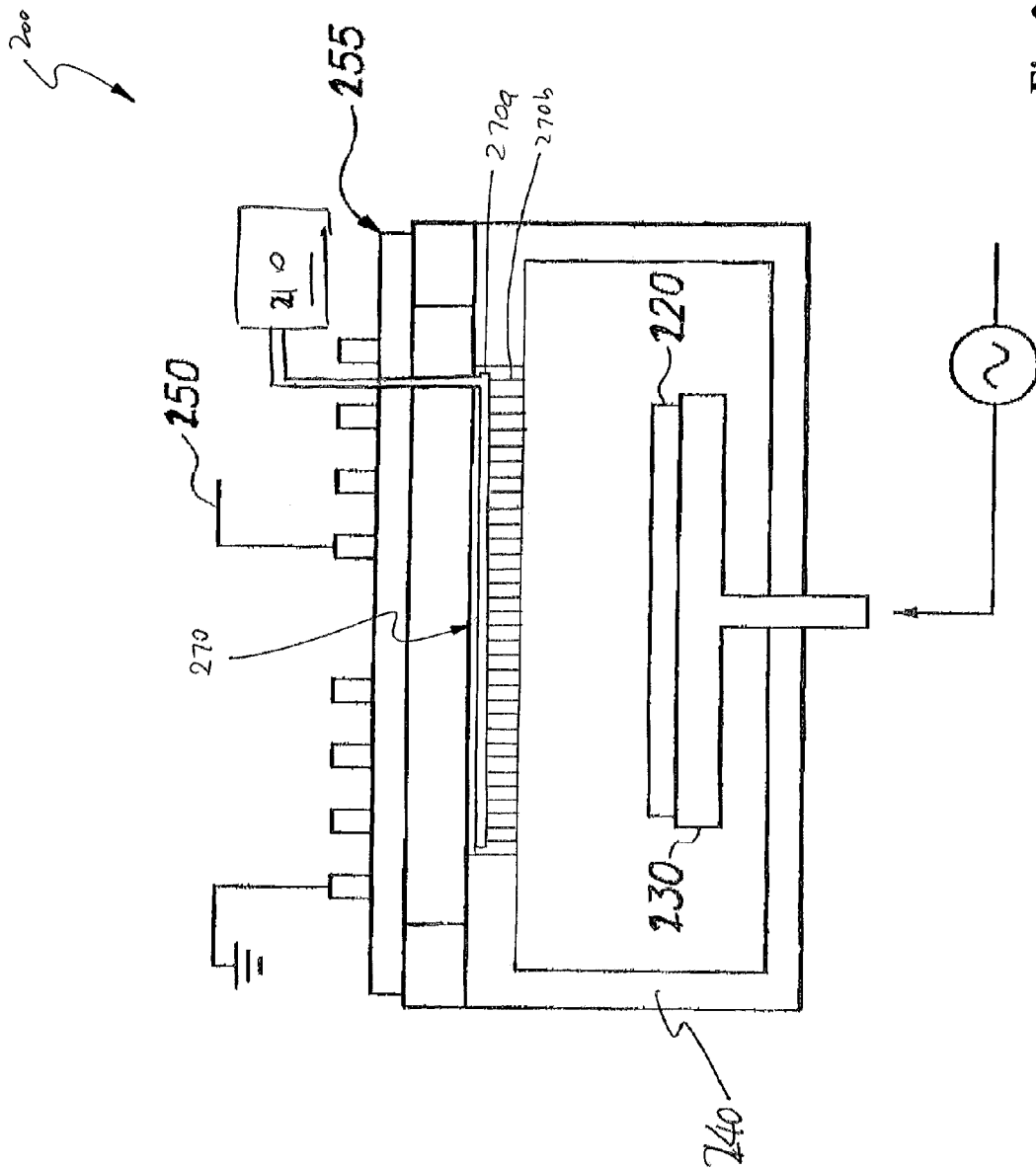
FIG. 2 shows a plasma processing apparatus according to a preferred embodiment.

According to an embodiment, as shown in FIG. 2, a plasma processing apparatus 200 for processing a substrate 220 comprises a substrate support 230 and a processing chamber 240 enclosing the substrate support 230. The substrate 220 may be, for example, a semiconductor wafer having diameters of 8 inches, 12 inches or larger. The substrate support 230 may comprise, for example, a radio frequency (RF) powered electrode. The substrate support 230 may be supported from a lower endwall of the chamber 240 or may be cantilevered, e.g., extending from a sidewall of the chamber 240. The substrate 220 may be clamped to the electrode 230 either mechanically or electrostatically.

The substrate 220 is processed in the processing chamber 240 by energizing a process gas in the processing chamber 240 into a high density plasma. A source of energy generates and maintains a high density (e.g., $10^{11}$-$10^{12}$ ions/cm$^3$) plasma in the chamber 240. For example, an antenna 250, such as the planar multiturn spiral coil shown in FIG. 2, a non-planar multiturn coil, or an antenna having another shape, powered by a suitable RF source and suitable RF impedance matching circuitry inductively couples RF energy into the chamber to generate a high density plasma. The RF power applied to the antenna 250 can be maintained at the same power level or varied according to different process gases used in the chamber 240 (e.g. etch gas containing $SF_6$ and deposition gas containing $C_4F_8$), during cycles of alternately supplying the etch gas or disposition gas preferably within a time period of less than about 1 s, more preferably less than about 200 ms. The chamber 240 is evacuated by a suitable vacuum pumping apparatus for maintaining the interior of the chamber 240 at a desired pressure (e.g., below 5 Torr, preferably 1-500 mTorr). The pressure can be maintained at the same level or varied during the etching and deposition cycles. A dielectric window, such as the planar dielectric window 255 of uniform thickness shown in FIG. 2, or a non-planar dielectric window is provided between the antenna 250 and the interior of the processing chamber 240 and forms a vacuum wall at the top of the processing chamber 240. A showerhead plate 270 can be disposed below or be part of the dielectric window 255. A gas delivery system 210 can be used to supply process gases into the chamber 240 through the showerhead plate 270. The gas delivery system alternately supplies etch gas or deposition gas into the chamber via fast switching valves (such as ALD valves) which open and close within 40 milliseconds, preferably within 30 milliseconds. The valves are on-off valves which do not direct the deposition gas to a bypass line while the etch gas is supplied to the showerhead or vice versa. ALD valves provide faster switching than MFC valves which can take 250 milliseconds to stabilize before opening or closing.

In a preferred embodiment, the showerhead plate 270 is separated from the dielectric window 255 by a plenum 270a and the showerhead plate 270 includes gas injection holes 270b operable to inject one or more process gases from one or more zones of the plenum into the chamber 240. The total volume of the plenum 270a is preferably no more than about 500 cm$^3$. The showerhead plate 270 is preferably made of an electrically insulating material, such as ceramic (e.g., alumina, silicon nitride, aluminum nitride, a doped silicon carbide, quartz, etc.). The gas holes have diameters of no greater than 0.06 inch and aspect ratios of at least 2. For example, the showerhead plate can have a thickness of at least 0.2 inch, preferably 0.2 to 0.4 inch. However, the showerhead plate can be incorporated in a dielectric window by forming the window from ceramic powder with the plenum therein, sintering and drilling the gas holes in the sintered window. The vertical distance (chamber gap) between a bottom surface of the showerhead plate 270 and the substrate 220 can be varied by moving the substrate support in a vertical direction to adjust the chamber gap in which plasma is generated between the showerhead plate and the substrate.

The substrate 220 preferably comprises a silicon material such as a silicon wafer and/or polysilicon. Various features such as holes, vias and/or trenches are to be etched into the silicon material. A patterned masking layer (e.g. photoresist, silicon oxide, and/or silicon nitride) having an opening pattern for etching desired features is disposed on the substrate 220.

Compared to the conventional plasma processing apparatus 100 with side gas injection, the plasma processing apparatus 200 can more rapidly and uniformly switch the process gas in the chamber gap from the etching gas to the disposition gas and vice versa. In one embodiment wherein the substrate 220 has a diameter of 300 mm and the chamber gap is greater than 4 inches, the apparatus 200 can essentially completely switch (e.g. at least 90%) the process gas in the plenum 270a and the gas injection holes 270b within about 200 milliseconds and essentially completely switch (e.g. at least 90%) the process gas in the chamber gap within about 700 milliseconds. Such rapid gas switching enables a significant increase in the etching rate of openings in silicon using the plasma processing apparatus 200 to over 10 µm/min and depending on the critical dimension (CD) of features being etched the etch rate can be higher than 20 µm/min whereas with side gas injection which provides etch rates of about 3 µm/min.

Figure 3:
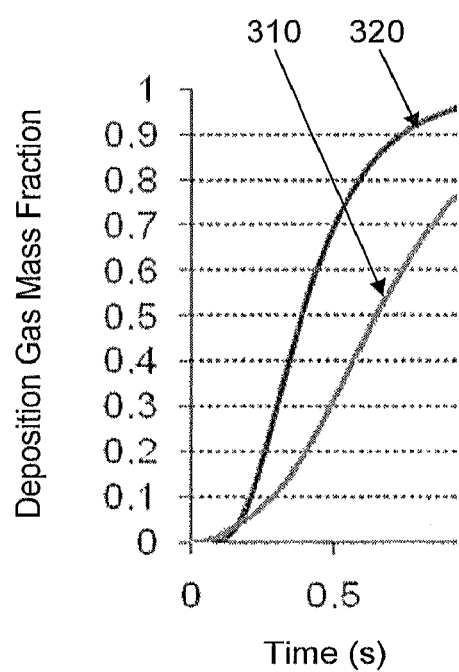
FIGS. 3, 4a and 4b show simulated performance of the plasma processing apparatus of FIG. 2 and the conventional plasma processing apparatus of FIG. 1.

FIG. 3 and Table 1 show performance of the apparatus 100 and the apparatus 200 in switching from the etching gas to the deposition gas in the chamber gap, wherein the substrate 220 has a diameter of 300 mm and the chamber gap is greater than 4 inches. In FIG. 3, trace 310 is the wafer average mass fraction of the deposition gas as a function of time in the apparatus 100 and trace 320 is the wafer average mass fraction of the deposition gas as a function of time in the apparatus 200. The gas switching time in milliseconds (ms) of the apparatus 200 is significantly shorter than that of the apparatus 100.

TABLE 1

| Deposition Gas Mass Fraction | Time (ms) | |
| --- | --- | --- |
| | Apparatus 200 | Apparatus 100 |
| 0.1 | 206 | 283 |
| 0.2 | 256 | 398 |
| 0.3 | 299 | 482 |
| 0.4 | 340 | 560 |
| 0.5 | 385 | 640 |
| 0.6 | 435 | 728 |
| 0.7 | 496 | 832 |
| 0.8 | 581 | |
| 0.9 | 725 | |

Figure 4A:
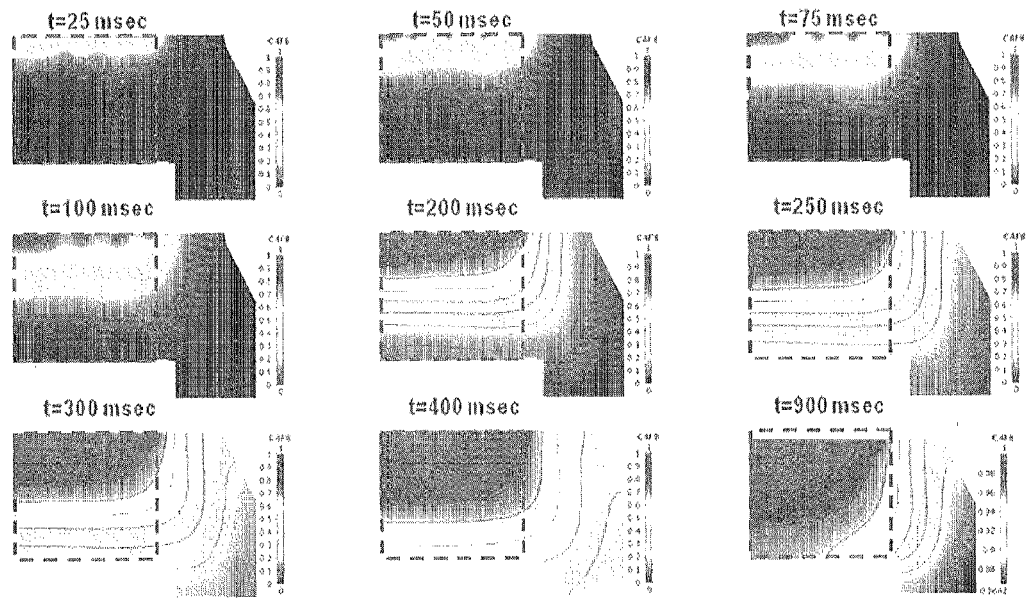
Figure 4B:
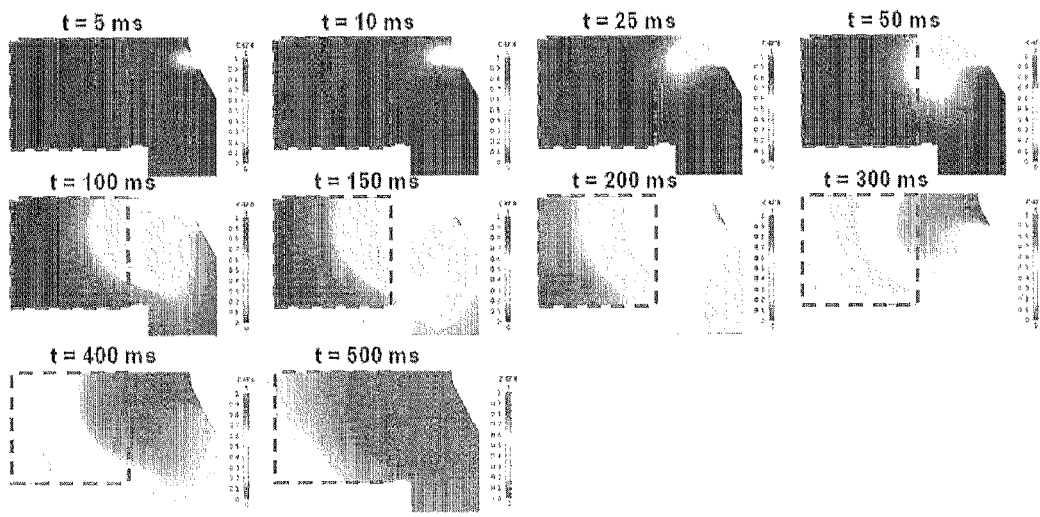

FIG. 4a shows simulated time dependent performance of the apparatus 100 and FIG. 4b shows simulated time dependent performance of the apparatus 200 in switching from $SF_6$ deposition gas to $C_4F_8$ etching gas in the chamber gap (space enclosed in the dotted box), wherein the substrate has a diameter of 300 mm, $C_4F_8$ is supplied at a flow rate less than 500 sccm, and the chamber gap is at least 4 inches. In apparatus 100, after 0.5 second a significant amount of $SF_6$ remains on the wafer surface whereas apparatus 200 can replace essentially all of the $SF_6$ gas with $C_4F_8$ in 0.5 second. In the apparatus 200, the process gas can be replaced more quickly and uniformly than the apparatus 100.

The plasma processing apparatus 200 preferably comprises a processing chamber in which a semiconductor substrate is processed, a substrate support, a dielectric window forming a wall of the chamber, an antenna operable to inductively couple RF energy through the dielectric window to generate and maintain a plasma in the processing chamber, a showerhead plate adjacent to or incorporated in the dielectric window, the showerhead plate having gas holes therein in fluid communication with a plenum below or in the dielectric window, the plenum having a gas volume of no greater than 500 cm$^3$, the gas holes extending between the plenum and a plasma exposed surface of the showerhead plate wherein the gas holes have an aspect ratio of at least 2. The gas delivery system is operable to alternately supply an etching gas and a deposition gas to the plenum and replace the etching gas in the plenum with the deposition gas within 200 milliseconds or replace the deposition gas in the plenum with the etching gas within 200 milliseconds. The plasma processing apparatus can be used to etch silicon on a semiconductor substrate supported on a substrate support at a rate of at least 10 μm/min.

The showerhead plate is preferably made of an electrically insulating material and includes no more than 600 gas holes, preferably less than 100 gas holes and the plasma generated by supplying RF power to the antenna is a high density plasma. The plasma processing apparatus is operable to essentially completely switch process gas in the plenum within 200 ms and in a plasma confinement zone (chamber gap) in the processing chamber from the etching gas to the deposition gas or vice versa within about 500 ms.

In the preferred embodiment, the etching gas is $SF_6$ and the deposition gas is $C_4F_8$. The showerhead plate can be bonded or vacuum sealed to the underside of the dielectric window disposed between the antenna and the processing chamber. In operation, the gas supply system does not divert the etching gas to a vacuum line during supply of the deposition gas to the plenum and does not divert the deposition gas to a vacuum line during supply of the etching gas to the plenum. If desired, the plenum can be divided into an inner zone in fluid communication with an inner group of the gas holes and an outer zone in fluid communication with an outer group of the gas holes.

Processing of a substrate using the plasma processing apparatus described above preferably comprises (a) supporting the substrate in the chamber, (b) supplying the etching gas to the plenum and flowing the etching gas through the gas holes in the showerhead plate into the chamber gap, (c) energizing the etching gas in the chamber into a first plasma and processing the substrate with the first plasma, (d) supplying the deposition gas to the plenum so as to substantially replace the etching gas and flowing the deposition gas through the gas holes in the showerhead plate into the chamber gap, (e) energizing the deposition gas in the chamber into a second plasma and processing the substrate with the second plasma, (f) repeating steps (b)-(e) with a total cycle time of no greater than 1.8 seconds.

The etching gas preferably replaces at least 90% of the deposition gas in the chamber gap within a period of about 500 milliseconds in step (b), and the deposition gas preferably replaces at least 90% of the etching gas in the chamber gap within a period of about 500 milliseconds in step (d). During the process, pressure in the plenum is at least 5 Torr during steps (b)-(e). During a cycle of supplying the etching gas and deposition gas, a total time of supplying the etching gas can be 1.3 seconds or less and a total time of supplying the deposition gas can be 0.7 seconds or less.

Chamber pressure can be adjusted such that pressure in the chamber gap during supply of the etching gas is greater than 150 mTorr and pressure in the chamber gap during supply of the deposition gas is less than 150 mTorr. In a preferred process, the etching gas is supplied to the plenum at a flow rate of at least 500 sccm and the deposition gas is supplied to the plenum at a flow rate of less than 500 sccm. Preferably, the etching gas and deposition gas are supplied to the plenum through a single opening at the center of an upper side of the dielectric window and the chamber gap between the substrate and the showerhead plate is greater than 4 inches. During the supply of the etching gas the substrate can be subjected to plasma etching of high aspect ratio openings with pressure in the chamber gap maintained at less than 150 mTorr for 200 milliseconds during a polymer clearing phase of the etching step and at over 150 mTorr for the remainder of the plasma etching step. During the supply of the deposition gas the second plasma can deposit a polymer coating on sidewalls of the openings with pressure in the chamber gap maintained at less than 150 mTorr for the entire deposition step. The etching gas can be one or more of $C_4F_8$, $XeF_2$, $NF_3$, Cl containing gas such as $CCl_4$ and the deposition gas can be one or more of $C_4F_8$, $C_4F_6$, $CHF_3$, $CH_2F_2$.

The etching gas can be supplied through a first valve to first and second gas lines which deliver the etching gas to inner and outer zones of the plenum wherein the first and second gas lines have equal conductance and the deposition gas is supplied through a second valve to third and fourth gas lines which deliver the deposition gas to inlets in the dielectric window in fluid communication with the inner and outer zones of the plenum wherein the third and fourth gas lines have equal conductance. Alternatively, the etching gas can be supplied through a first valve to a single gas inlet in the center of the dielectric window and the deposition gas can be supplied to the single gas inlet through a second valve, the first and second valves being ALD valves having opening times of no greater than 30 milliseconds. For example, fast acting Swagelok ALD valves can be used wherein fast acting solenoid valves upon receiving a signal from a controller send pneumatic air to a fast switching valve within 10 ms and total time to open or close the fast switching valve can be 30 ms or less.

In this specification, the word "about" is often used in connection with a numerical value to indicate that mathematical precision of such value is not intended. Accordingly, it is intended that where "about" is used with a numerical value, a tolerance of 10% is contemplated for that numerical value.

While the plasma processing apparatus operable to quickly switch process gas has been described in detail with reference to specific embodiments thereof, it will be apparent to those skilled in the art that various changes and modifications can be made, and equivalents employed, without departing from the scope of the appended claims.

I claim:

1. An inductively coupled plasma processing apparatus wherein semiconductor substrates are subjected to plasma etching, comprising:
   a processing chamber in which a semiconductor substrate is processed;
   a substrate support on which the semiconductor is supported during processing thereof;
   a dielectric window forming a wall of the chamber;
   an antenna operable to inductively couple RF energy into the chamber and energize process gas into plasma in a chamber gap between the substrate support and the dielectric window;
   a showerhead plate adjacent to or incorporated in the dielectric window, the showerhead plate having gas holes therein in fluid communication with a plenum below or in the dielectric window, the plenum having a gas volume of no greater than 500 cm$^3$, the gas holes extending between the plenum and a plasma exposed surface of the showerhead plate wherein the gas holes have an aspect ratio of at least 2; and
   a gas delivery system operable to alternately supply process gas comprising an etching gas and a deposition gas to the plenum such that the etching gas in the plenum is replaced with the deposition gas within 200 milliseconds or the deposition gas in the plenum is replaced with the etching gas within 200 milliseconds, the plasma processing apparatus being operable to etch openings in silicon material on the semiconductor substrate at a rate of at least 10 μm/minute.

2. The plasma processing apparatus of claim 1, wherein the showerhead includes at most 600 gas holes.

3. The plasma processing apparatus of claim 1, wherein the plasma is a high density plasma.

4. The plasma processing apparatus of claim 1, wherein the plasma processing apparatus is operable to essentially completely switch process gas in the chamber gap from the etching gas to the deposition gas or vice versa within about 500 ms.

5. The plasma processing apparatus of claim 1, wherein the etching gas is $SF_6$ and the deposition gas is $C_4F_8$.

6. The plasma processing apparatus of claim 1, the processing chamber includes a single gas inlet at a center of the dielectric window through which the process gas is delivered to the plenum.

7. The plasma processing apparatus of claim 1, wherein the gas supply system does not divert the etching gas to a vacuum line during supply of the deposition gas to the plenum and does not divert the deposition gas to a vacuum line during supply of the etching gas to the plenum.

8. The plasma processing apparatus of claim 1, wherein the plenum comprises discrete inner and outer zones, the inner zone in fluid communication with an inner group of the gas holes and the outer zone in fluid communication with an outer gas supply inlet and an outer group of the gas holes.

* * * * *